US006873638B2

(12) United States Patent
Haase et al.

(10) Patent No.: US 6,873,638 B2
(45) Date of Patent: Mar. 29, 2005

(54) LASER DIODE CHIP WITH WAVEGUIDE

(75) Inventors: Michael Albert Haase, Saint Paul, MN (US); Alessandra Ohana Pinto Chiareli, Saint Paul, MN (US); Thomas James Miller, Woodbury, MN (US); Donald Charles Grillo, Eagan, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 204 days.

(21) Appl. No.: 10/177,176

(22) Filed: Jun. 21, 2002

(65) Prior Publication Data

US 2003/0007535 A1 Jan. 9, 2003

Related U.S. Application Data

(60) Provisional application No. 60/302,268, filed on Jun. 29, 2001.

(51) Int. Cl.$^7$ ................................................ H01S 5/00
(52) U.S. Cl. ............................ 372/50; 372/43; 372/44; 372/45; 372/46; 372/47; 372/48; 372/49; 372/50; 372/102
(58) Field of Search .............................. 372/43–50, 102

(56) References Cited

U.S. PATENT DOCUMENTS

| | | | | |
|---|---|---|---|---|
| 4,875,216 A | * | 10/1989 | Thornton et al. ............. 372/45 |
| 5,144,634 A | | 9/1992 | Gasser et al. |
| 5,389,396 A | | 2/1995 | Razeghi |
| 5,585,957 A | * | 12/1996 | Nakao et al. ................ 359/248 |
| 5,613,995 A | | 3/1997 | Bhandarkar et al. |
| 5,689,358 A | * | 11/1997 | Nakao et al. ................ 359/248 |
| 5,720,893 A | | 2/1998 | Ben-Michael et al. |
| 5,764,842 A | * | 6/1998 | Aoki et al. .................. 385/131 |
| 5,870,417 A | | 2/1999 | Verdiell et al. |
| 5,879,962 A | | 3/1999 | DePuydt et al. |
| 5,892,586 A | * | 4/1999 | Thony et al. ................ 356/437 |
| 5,933,562 A | * | 8/1999 | Dutting et al. .............. 385/131 |
| 5,982,973 A | * | 11/1999 | Yan et al. .................... 385/141 |
| 6,081,632 A | * | 6/2000 | Yoshimura et al. ............. 385/5 |
| 6,087,725 A | * | 7/2000 | Yoshii et al. ................ 257/744 |
| 6,103,458 A | * | 8/2000 | Seki ............................ 430/393 |
| 6,130,972 A | | 10/2000 | Shiraishi |
| 6,137,117 A | * | 10/2000 | Feldstein et al. ............ 250/573 |
| 6,160,660 A | * | 12/2000 | Aina et al. ................. 359/341.2 |
| 6,174,748 B1 | * | 1/2001 | Jeon et al. ..................... 438/31 |
| 6,181,722 B1 | * | 1/2001 | Dutting et al. ................ 372/45 |
| 6,263,140 B1 | | 7/2001 | Stegmuller |
| 6,312,581 B1 | | 11/2001 | Bruce et al. |

FOREIGN PATENT DOCUMENTS

WO          WO 02/42808 A2    5/2002

OTHER PUBLICATIONS

Book Excerpt: Casey, Jr. et al., *Heterostructure Lasers*, Part B Materials and Operating Characteristics, Academic Press, 1978, pp. 252–254.
Book Excerpt: Fukuda, *Reliability and Degradation of Semiconductor Lasers and LEDs*, Artech House, (1991), pp. 128–137.
Book: Tamir (Ed.), *Guided–Wave Optoelectronics*, Second Edition, Springer–Verlag, Apr. 24, 1992.
Article: Bumbra et al., "High Power Operation of GaInAsP/ GaInAs MQW Ridge Lasers Emitting at 1.48 $\mu$m," *Electronics Letters*, vol. 26, (1990), pp. 1755–1756.
Article: Germann et al., "Silicon Oxynitride Layers for Optical Waveguide Applications," *Journal of the Electrochemical Society*, 147 (6), (2000), pp. 2237–2241.
Article: Delavaux et al., "Multi–Stage Erbium–Doped Fiber Amplifier Designs," *Journal of Lightwave Technology*, vol. 13, No. 5, May 1995, pp. 703–720.

(Continued)

*Primary Examiner*—Don Wong
*Assistant Examiner*—Delma R. Flores-Ruiz
(74) *Attorney, Agent, or Firm*—Melanie Gover

(57) ABSTRACT

Disclosed is a laser having a laser diode coupled with a passive intra-cavity tapered waveguide.

26 Claims, 3 Drawing Sheets

OTHER PUBLICATIONS

Article: Namiki et al., "Ultrabroad–Band Raman Amplifiers Pumped and Gain–Equalized by Wavelength–Division–Multiplexed High–Power Laser Diodes," *IEEE Journal on Selected Topics in Quantum Electronics*, vol. 7, No. 1, Jan./Feb. 2001, pp. 3–16.

Article: Birkin et al., "3.6 mW Blue Light by Direct Frequency Doubling of a Diode Laser Using an Aperiodically Poled Lithium Niobate Crystal," *Applied Physics Letters*, vol. 78, No. 21, May 21, 2001, pp. 3172–3174.

U.S. Appl. No. 10/177,102, filed Jun. 21, 2002, Optical Waveguide.

Ben–Michael, R. et al., "InP Based Multiple Quantum Well Lasers with an Integrated Tapered Beam Expander Waveguide", IEEE Photonics Technology Letters, IEEE Inc., New York, US, vol. 6, No. 12, Dec. 1, 1994, pp. 1412–1414.

Fang, R.Y. et al., "1.55–$\mu$m InGaAsP–InP Spot–Sixe–Converted (SSC) Laser with Simple Technological Process", IEEE Photonics Technology Letters, IEEE, Inc., New York, US, vol. 10, No. 6, Jun. 1, 1998, pp. 775–777.

Itaya, Y. et al., "Spot–Size Converter Integrated Laser Diodes (SS–LD's)", IEEE Journal of Selected Topics in Quantum Electronics, IEEE Service Center, US, vol. 3, No. 3, Jun. 1, 1997, pp. 968–974.

Chen, C–H et al., "Semiconductor Optical Amplifier Array Coupled to Uncoated Flat–End Fibers with Integrated Beam Expanders and $TiO_2$ Antireflection Coatings", IEEE Journal of Selected Topics In Quantum Electronics, IEEE Service Center, US, vol. 3, No. 6, Dec. 1, 1997, pp. 1421–1428.

\* cited by examiner

LASER DIODE CHIP WITH WAVEGUIDE

This application claims priority to U.S. Provisional Patent Application No. 60/302,268, filed Jun. 29, 2001.

TECHNICAL FIELD

This invention relates to waveguides for use with laser diodes.

BACKGROUND

High power laser diodes may be used for, e.g., optical communications, printing, generation of light by second harmonic generation, and medical applications. They are frequently used in conjunction with optical fibers. For many applications, the laser is required to operate in a single transverse optical mode. A single transverse-mode laser diode may have, for example, a 1 $\mu$m×5 $\mu$m wide output aperture and typically may provide output power up to about 0.4 W. A narrow aperture is needed to produce a single transverse optical mode. However, a very high power density may exist at the aperture, which is a limiting factor for single-transverse mode laser diodes. Alternatively, a multi-mode laser diode may have, for example, a 1 $\mu$m×100 $\mu$m wide output aperture and operate at output powers up to about 4 W. However, a multi-mode laser does not produce a single "spot" of light, but instead produces a series of spots, which is difficult to focus into a small area such as the end of an optical fiber. See generally Heterostructure Lasers, Part B: Materials and Operating Characteristics, H. C. Casey, Jr., and M. B. Panish, Academic Press, 1978, pp. 252–254.

The maximum output power that a laser diode may reliably provide is generally limited by damage to the semiconductor material caused by the high optical power density in the optical cavity. Often this damage first occurs at a facet mirror, and is referred to as Catastrophic Optical Damage (COD). It is well known that COD may limit power density at laser diode facets. See generally Reliability and Degradation of Semiconductor Lasers and LEDS, Mitsuo Fukuda, Artech House, 1991, pp. 128 –136; COD occurs because crystal defects at the facet absorb light during laser operation and thereby heat the facet. When the semiconductor comprising the laser diode is heated, the band gap energy is reduced, making the absorption even stronger, which in turn heats the facet even more and a runaway effect takes place thereby leading to COD. This typically causes the material near the facet to melts and/or ablate. Known ways to minimize this runaway effect include sophisticated techniques for coating the facets (see U.S. Pat. No. 5,144,634) or using a semiconductor other than aluminum containing materials (such as AlGaAs), e.g., GaInP (see U.S. Pat. No. 5,389,396), which is aluminum-free and oxidizes less, causing fewer defects at the facet. But at high output power, reliability is still compromised, limiting output power to about 4 W for a 100 $\mu$m wide multi-mode laser, or 400 mW for a single transverse mode laser diode.

Thermal effects may also limit the output power of a single-transverse-mode laser diode. At high input current levels, heating of the laser's active stripe region increases the index of refraction relative to the adjacent regions. This typically causes the laser waveguide to operate higher-order optical modes, which is unacceptable for many applications.

SUMMARY OF INVENTION

At least one aspect of the present invention addresses the problems associated with high power density in laser diodes.

One aspect of this invention provides a laser comprising a semiconductor laser diode chip coupled to a passive intra-cavity tapered waveguide. "Passive" means the waveguide is not providing any optical gain. "Intra-cavity" means within the optical cavity. The waveguide can provide a reliable single-transverse-mode operation at high output power. The waveguide may comprise a material having a high optical damage threshold. The material may be a semiconductor having a large band gap energy, a glass, or it may be a crystalline material, e.g., a single crystal. The crystalline material may be a II-VI or III-V (on the Periodic Table) compound semiconductor. The waveguide may have a length of 0.5 cm or more.

Reflections at the interface of the laser diode chip and waveguide chip may be minimized. This may be done by providing an anti-reflective coating on the laser diode chip at the interface (and, optionally, providing an index matching fluid between the laser diode chip and waveguide chip). Alternatively, anti-reflective coatings may be provided on both the laser diode chip and waveguide chip at their interface.

The laser of the present invention may be used in an optical amplifier. The optical amplifier may be doped with a rare earth metal such as erbium and/or thulium. In this case, the laser of the present invention may have an output wavelength of about 980 or 1480 nm. The amplifier may be a raman amplifier. In this case, the laser of the present invention may have an output wavelength of about 1365nm to about 1530 nm.

The laser of the present invention may also be used in a laser printing system.

An advantage of at least one embodiment of the present invention is that it overcomes fundamental limitations to power density, allowing high output power in a single transverse mode.

Another advantage is that it can use well-known technologies used for manufacturing high-power wide aperture laser diodes.

As used in this application:

"damage threshold" refers to the minimum optical power density at which a material is damaged such that it no longer functions as intended, and "large band gap" is used to describe a semiconductor with a band gap energy substantially larger than the photon energy of the laser light, preferably greater than twice the photon energy.

DETAILED DESCRIPTION

Figure 1:
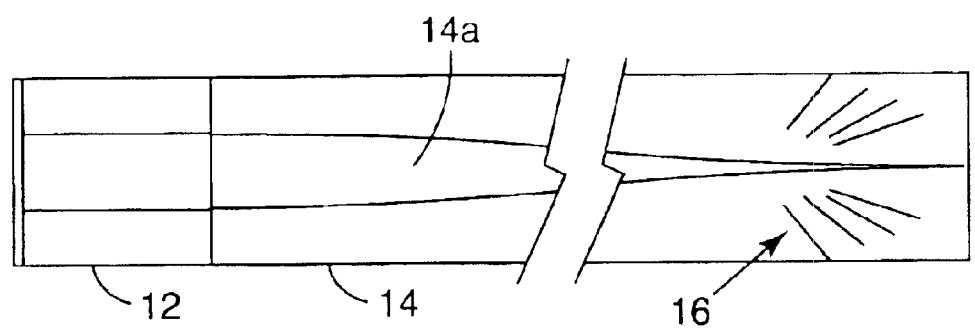
FIG. 1 illustrates a planar waveguide chip butt-coupled to a laser diode chip, per the present invention.

One aspect of this invention provides a laser comprising a semiconductor laser diode chip optically coupled to a passive intra-cavity tapered waveguide. Another aspect of this invention is that at least a portion of the passive waveguide is designed to support only a single transverse optical mode. At least one aspect of the present invention uses a tapered intra-cavity planar waveguide to couple the output of a wide aperture (e.g., greater than 10 μm wide, including greater than 20 μm wide) semiconductor laser diode chip into a narrow, single-mode waveguide, thereby forcing the optical cavity, including the laser diode chip, to operate only in a single transverse mode even when the laser diode chip would operate in multiple modes without the waveguide. This is accomplished because the tapered waveguide supports only a single transverse mode at the narrow end. This aspect of the invention is illustrated by FIG. 1, which shows a top view of laser diode chip 12 butted against waveguide chip 14 such that the light generated in laser diode chip 12 enters the widest portion of tapered waveguide 14a. The tapered shape of tapered waveguide 14a then causes the optical mode to be confined to a narrow single-transverse-mode waveguide section by the time it reaches the opposite end of the waveguide, where scattering segments 16 are located.

Figure 2:
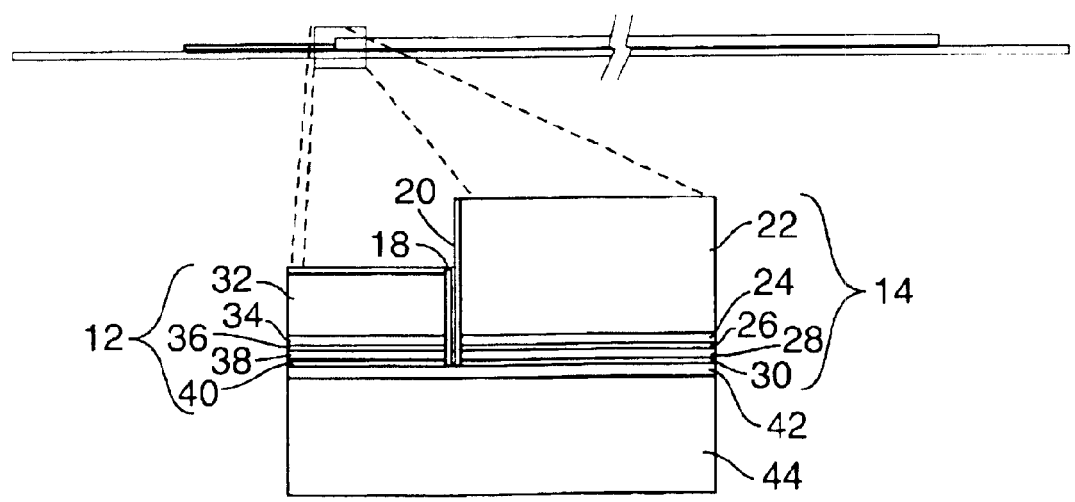
FIG. 2 is a side view illustration of the coupled waveguide chip and laser diode chip of FIG. 1.

One aspect of the invention involves minimizing the reflections at the interface of the laser diode chip and waveguide chip. FIG. 2 illustrates a side view of one embodiment that achieves this by the presence of anti-reflective coatings 18, 20 on the abutting edges of both laser diode chip 12 and waveguide chip 14. In an alternative embodiment, the anti-reflective coating is coated only on the laser diode chip. The role of the anti-reflection coatings is to provide efficient optical coupling between the laser diode chip and the passive waveguide chip; that is, to minimize reflections at that interface, thereby minimizing optical losses in the desired optical cavity mode, and eliminating the Fabry-Perot modes of the laser diode chip itself. Techniques for applying anti-reflective coatings are well known in the art. In the simplest versions, the antireflective coating is a material with a refractive index of approximately the square-root of the effective index of the optical mode of the chip to which it is applied. The appropriate thickness is then equal to one fourth of the wavelength of light of interest (in the coating material).

Another aspect of the invention ensures that the waveguide chip 14 does not support low loss slab waveguide modes outside of the tapered waveguide 14a. This may be accomplished by providing disconnected waveguide segments, e.g, scattering segments 16, as shown in FIG. 1, which scatter any light in slab modes.

In general, as illustrated in FIG. 2, waveguide chip 14 comprises a slab waveguide including substrate 22, lower cladding layer 24, core layer 26, an upper cladding layer 28, and bonding layer 30. These layers are aligned with the corresponding layers of the laser diode chip, i.e., substrate 32, lower cladding layer 34, core layer 36, an upper cladding layer 38, and bonding layer 40. In some embodiments, laser diode chip 12 and waveguide chip 14 are mounted on submount 44, e.g., a thin silicon wafer, via solder layer 42 (e.g., indium). Such mounting enables good coupling between the optical modes of the laser chip and the tapered waveguide. The uniformity and smoothness of the solder is important for good vertical alignment because the optical mode of the fabricated device has a vertical dimension (FWHM) of, typically, about 1 μm. Submount 44 is preferably attached to a heat sink or a thermoelectric cooler (not shown) to remove excess heat from the laser diode chip during operation.

Appropriate compositions and thicknesses of the core layer, lower cladding layer, upper cladding layer, and any additional layer(s) may be designed through numerical modeling. One well-known waveguide modeling technique is the "transfer-matrix" approach (see, for example, Guided-Wave Optoelectronics, Theodor Tamir (Ed.), 2nd Edition, Springer-Verlag). Alternatively, commercial waveguide modeling tools may be used, including OptiBPM, from OptiWave Corporation, Ottawa, ON, Canada.

To enable efficient coupling between the laser diode chip and the tapered waveguide, the optical modes of the laser diode chip and the tapered waveguide preferably have nearly the same vertical size and profile. Alignment is facilitated if the size of the modes is large (i.e., the cores are thick, e.g., 0.5 μm–3 μm), although a thick core can lead to higher threshold current density in the laser diode chip.

The waveguide chip of the present invention may be patterned to form the lateral taper by any of a number of techniques, typically involving traditional photolithography. One method of patterning of the tapered waveguide starts with an unpatterned slab waveguide, and uses photoresist deposited on the upper cladding layer to define the desired shape of tapered waveguide. Then the exposed portion of the upper cladding layer may be etched away using any appropriate technique (depending on the material) including wet chemical etching, reactive ion etching, sputtering, or ion beam etching to form a ridge waveguide. Optionally, the waveguide structure may then be planarized by depositing a filler material into the etched region. This aspect of the invention is illustrated by ridge waveguide 62 and filler material 60 of FIG. 5. Typically the filler material will have a lower index of refraction than the upper cladding (to provide lateral optical confinement).

At least one aspect of the present invention includes a waveguide design that enables the use of relatively inexpensive and readily available wide-aperture multi-mode semiconductor laser chips to make high-power lasers that operate in a single transverse mode. Suitable semiconductor materials include, but are not limited to III-V compound semiconductors and alloys including GaInP—GaInAs (See, e.g., U.S. Pat. No. 5,389,396), AlGaAs—InGaAs, GaInAsP—InP (see, e.g., "High power operation of GaInAsP/GaInAs MQW ridge lasers emitting at 1.48 μm," B. S. Bumbra, et al., Electronics Letters vol. 26, pp. 1755–1756 (1990)) or AlGaInAs—InP.

Preferably, materials used to make the waveguides have the following characteristics: transparency at the laser wavelength, high optical damage threshold, ability to be patterned, availability in pieces longer than required for the tapered waveguides, ability to be cleaved or polished to form facets, and thermal expansion similar to its substrate. In addition, the core layer should have a higher index of refraction than adjacent layers.

The passive waveguide chip may be made of one or more transparent material, such as ZnSe (and other II-VI compound semiconductors and alloys), III-V semiconductors and alloys, and silica or non-silica glasses. These materials can have a band gap energy that is much greater than the laser photon energy, so that during operation, there is little optical absorption. Preferably, the band gap should be greater than two times the laser photon energy to minimize non-linear absorption. Generally, the refractive indices of these materials can be adjusted by varying the composition.

In general, II-VI compounds offer favorable properties for waveguides. II-VI compound semiconductors and alloys are crystalline materials. When grown on a single crystal substrate, such as GaAs, they preferably take the form of a single crystal and have the added advantage of allowing formation of high-quality facets by cleaving, which greatly facilitates manufacturing. An example of a suitable II-VI semiconductor passive waveguide includes a BeZnTe core with BeZnSe cladding layers. These alloys may be grown by molecular beam epitaxy (MBE) on a GaAs substrate and patterned (for example) by ion beam etching. Other examples of suitable II-VI alloys include MgZnSSe or BeMgZnSe grown on GaAs or ZnSe substrates, and MgZnCdSe grown on InP substrates.

In some embodiments, the tapered passive waveguide may comprise III-V semiconductors or alloys. III-V semiconductor materials suitable for the passive tapered waveguide chip include, for example, AlGaAs or AlGaInP grown on GaAs or AlGaInN grown on sapphire substrates. These materials have the advantage of being well known and of high quality. Because these semiconductors may be grown undoped for these passive waveguides, the optical absorption can be low. For high power operation, the band gap of the semiconductors used for the passive tapered waveguide is preferably greater than twice the laser photon energy. These III-V alloys may be grown by molecular beam epitaxy (MBE) or metal organic chemical vapor deposition (MOCVD), and may be patterned (for example) by wet etching or reactive ion beam etching.

Optical waveguides made with silica, doped-silica (including, silica doped with, e.g., Al, Ge, P, Ti, Ta, Hf, Zr, B, or F), and other glasses are well known. One important example is silicon oxynitride ($SiO_xN_y$), in which the refractive index of the silicon oxynitride is controlled by the nitrogen content. These waveguides may be deposited on many different substrates, including silicon wafers. In one embodiment the substrate is a silicon wafer, the lower cladding is silica, the core is silicon oxynitride and the upper cladding is silica. Patterning of the waveguide may be achieved by reactive ion etching of the core before depositing the upper cladding. (See, for example, "Silicon Oxynitride Layers for Optical Waveguide Applications," R. Germann et al., *Journal of the Electrochemical Society*, 147 (6), pp. 2237–2241 (200).)

Figure 6:
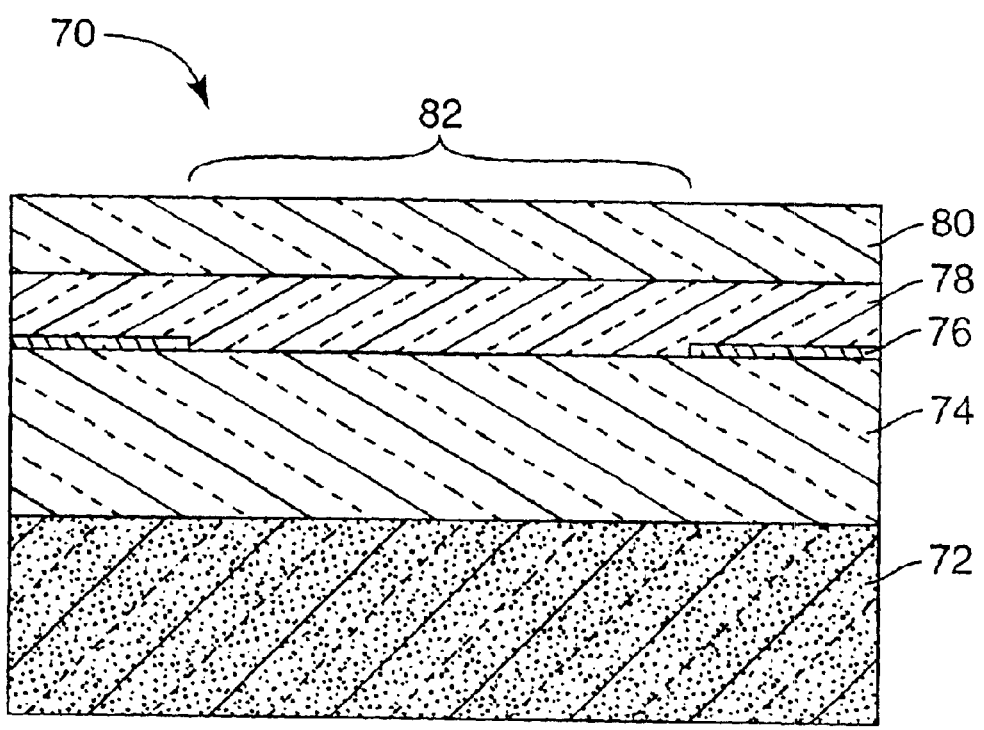
FIG. 6 illustrates a silicon oxynitride waveguide cross-section.

A technique for patterning an alternative glass waveguide embodiment, as illustrated in FIG. 6, includes depositing and patterning an optical confinement material 76 adjacent to the core layer 78, outside of the desired tapered waveguide region 82. If the optical confinement material 76 has a lower refractive index than the adjacent cladding layer 74, the lateral optical confinement is achieved.

Another aspect of the invention utilizes a Bragg grating to provide optical feedback to stabilize the emission wavelength of the laser. The Bragg grating can be formed in a section of the tapered waveguide. The grating may be formed, e.g., by etching shallow grooves in the substrate before growing the waveguide layers, by etching shallow grooves in the waveguide layers themselves, or by patterning a Bragg grating in an optical confinement material (e.g., $MgF_2$). Alternatively, the output of the laser (with tapered waveguide) may be coupled into a fiber pigtail that includes a fiber Bragg grating.

The high power operation of the laser diode having a passive intracavity tapered waveguide can enable significant improvement of the design and performance of optical amplifiers. Suitable optical amplifiers include rare earth doped fiber amplifiers, such as those doped with erbium, and optionally doped with other materials such as thulium (see, for example, "Multi-stage erbium-doped fiber amplifier designs", J.-M. P. Delavaux, J. A. Nagel, *Journal of Lightwave Technology*, Volume: 13 Issue: 5, (1995) Pages: 703–720). For these types of amplifiers, the laser diode is used as the 980 nm and/or 1480 nm pump laser.

The laser diode having an intra-cavity tapered waveguide may also be used with a Raman fiber amplifier system. For these types of amplifiers, the laser diode is used as a 1365 nm to 1530 nm pump laser (see, for example, "Ultrabroadband Raman amplifiers pumped and gain-equilized by wavelength-division-multiplexed high-power laser diodes," by S. Namiki and Y. Emori, *IEEE Journal on Selected Topics in Quantum Electronics*, vol. 7, p. 3 (2001)).

The laser diode having a passive intra-cavity tapered waveguide is also suitable for use in printing systems. In a printing system that uses, for example, ablation or heat-induced oxidation to create an image, a single mode laser source with a high power density is advantageous because the optical design of the laser scanning system can be optimized. By beginning with a high power, small aperture laser source, a magnification of the beam diameter can be utilized which results in a longer depth of focus while still achieving the required power density. A long depth of focus can eliminate the need for dynamic focusing in the printing system.

Other suitable applications for a laser diode with a passive intra-cavity tapered waveguide include the primary beam in Second Harmonic Generation (SHG) laser systems, which are used to generate light with a wavelength one half that of the primary beam. (See, for example, "3.6 *mW blue light by direct frequency doubling of a diode laser using an aperiodically poled lithium niobate crystal,*" D. J. L. Birkin, et al., *Applied Physics Letters*, vol. 78, p 3172, (2001)). In these non-linear devices, conversion efficiency increases with single-mode input power; therefore, the present invention offers a substantial advantage in the performance of SHG systems that utilize direct frequency doubling of a diode laser.

The following examples illustrate the present invention.

EXAMPLES

Simulation Results

Figure 3:
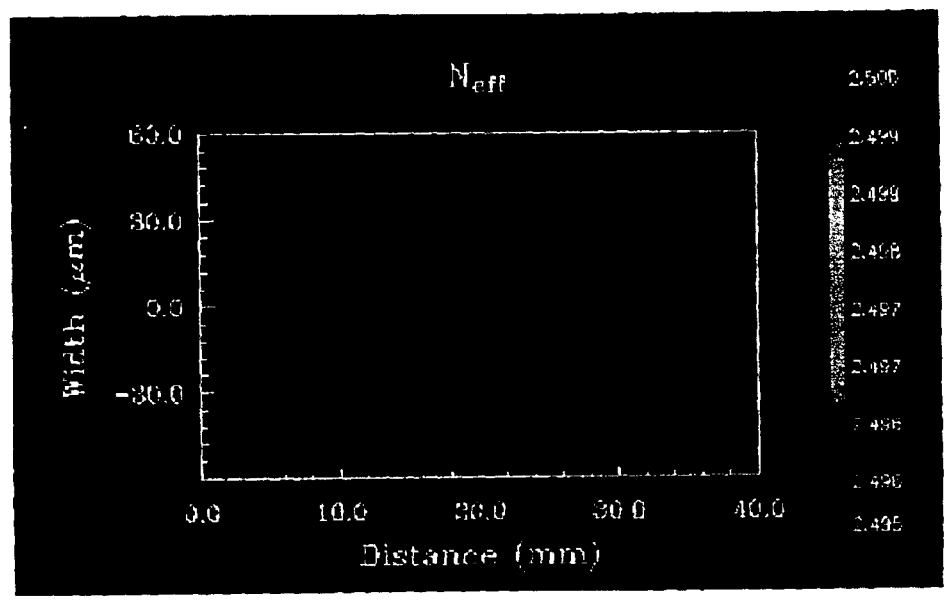
FIG. 3 illustrates a model of the refractive index values of a tapered waveguide of the present invention.
Figure 4:
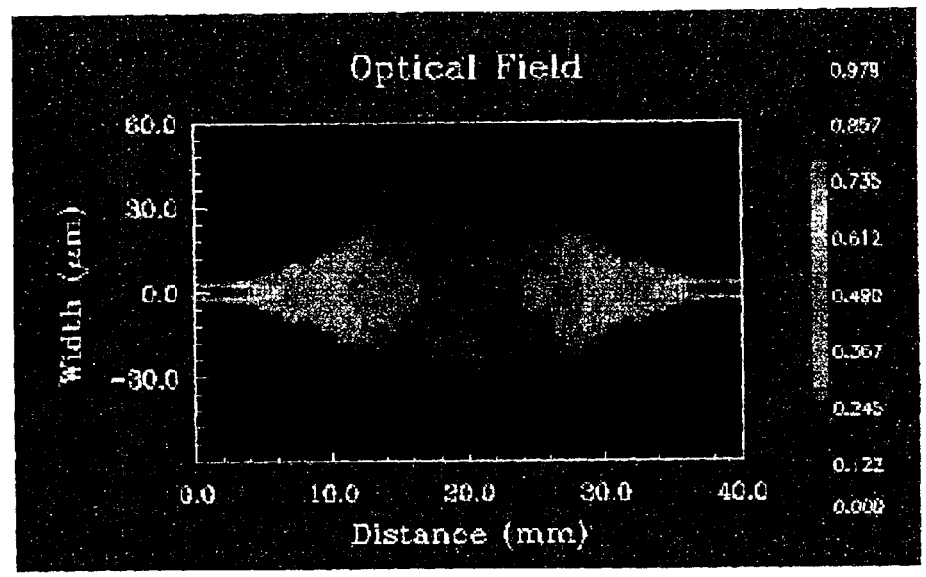
FIG. 4 shows a model of the calculated light intensity within a tapered waveguide of the present invention.

Modeling carried out using commercial waveguide modeling tool OptiBPM, available from OptiWave Corporation, Ottawa, ON, Canada shows that the taper profile of the waveguide is preferably of the raised sine form:

$$w(z) = w_1 + \frac{w_2 - w_1}{L}z - \frac{w_2 - w_1}{2\pi}\sin\left(\frac{2\pi z}{L}\right)$$

where w(z) is the width of the tapered waveguide as a function of z (distance in the direction of light propagation), L is the length of the tapered waveguide, and w1 and w2 are the widths of the waveguide at either end. FIGS. 3 and 4 are simulation results from modeling a tapered waveguide. For simulation purposes, a mirror image of the waveguide was used to generate a 100 μm wide single mode input for the tapered waveguide. This effectively represented a round-trip within the laser cavity. FIG. 3 shows the waveguide structure in terms of refractive index values (waveguide index=2.5, cladding index=2.495) and FIG. 4 shows the optical field amplitude as a function of z, the direction of propagation along the waveguide. A Power Overlap Integral of output field with input field showed that 97% of the power remains. In other words, there was a 0.13 dB round-trip propagation loss.

Further modeling has shown that when using a raised-sine taper, the required length of the taper depends on the square of the width of the waveguide at the wide end (all other parameters being held constant). For example, if a given tapered waveguide design requires 2 cm for a 100 μm "wide" facet, then a 0.5 cm taper would be required for a 50 μm "wide" facet. Other taper profiles may also be used, e.g, a linear taper, but these may require a longer tapered region.

Example 1

980 nm Laser

This example describes a 980 nm laser including an AlGaAs—GaInAs laser diode chip, a BeZnSe—BeZnTe tapered waveguide, and a silicon submount.

AlGaAs—GaInAs Laser Diode Chip

In this example a laser diode chip is grown by molecular beam epitaxy (MBE) on a (100) GaAs:Si semiconductor wafer. The lower cladding is $Al_xGa_{1-x}As$:Si (x=0.2, n=$10^{17}$ cm$^{-3}$), 1 μm thick. The active region (laser waveguide core) is 1 μm thick undoped GaAs with three $Ga_yIn_{1-y}As$ quantum wells (y=0.8) in its center. The wells are separated from each other by 20 nm of GaAs. The thickness (growth time) of the quantum wells are adjusted to provide the desired laser wavelength (980 nm), and are approximately 7 nm. The upper cladding is $Al_xGa_{1-x}As$:Be (x=0.2, p=$10^{17}$ cm$^{-3}$), 1 μm thick. The contact layer is GaAs:Be (p=$10^{19}$ cm$^{-3}$, 50 nm thick).

Fabrication of the laser diode chip begins with deposition of the p-ohmic contact metal, consisting of 20 nm Pd, 100 nm Au and 2 nm Ti, on the contact layer. The Ti facilitates adhesion of photoresist in the next step. A 75 μm wide photoresist stripe is patterned on the p-ohmic contact metal, carefully aligned to a <110> axis. The wafer is then patterned by ion beam etching (500 eV Xe+ ions), etching through the p-ohmic contact metal, and 0.25 μm into the semiconductor. The etched wafer is then immediately moved to a vacuum evaporator, where 0.37 μm of $Al_2O_3$ is deposited by electron-beam evaporation. The photoresist stripe is then stripped with acetone, lifting off the $Al_2O_3$ over the unetched stripe, and leaving a planar surface. Next, after photoresist is again applied to the top surface and patterned, bonding metal (100 nm Ti and 300 nm Au) is deposited and patterned by lift-off into 1000 μm wide stripes, centered over the 75 μm wide active region. At this point the processing of the top surface is complete. The wafer is mounted with wax on a polishing tool, and the back side is polished to a specular surface. After being removed from the polishing tool, the back side of the wafer is cleaned and slightly etched. Photoresist is again applied and patterned and the back side n-ohmic contact metal (10 nm Pd, 25 nm Ge, 300 nm Au) is deposited by vacuum evaporation, and patterned into 1000 μm stripes by lift-off. These stripes are aligned with respect to the active stripes on the front of the wafer so as to allow a "window" through which one can see the active stripe through the GaAs substrate, using an infrared microscope.

The wafer is then cleaved into bars of length 1000 μm, and an antireflective coating (12.7 nm of $Al_2O_3$) is applied to the front facets, and a high reflectivity coating (a quarter-wavelength stack of $Al_2O_3$ and $MgF_2$) is applied to the rear facets. The bars are then diced into chips (1500 μm wide), which are ready for assembly. In each of these chips, the center of the optical mode is 2.0 μm from the upper surface of the bonding metal.

BeZnTe Tapered Waveguide

Growth of the II-VI waveguide materials is carried out inside a molecular beam epitaxy system. Such a system typically comprises a chamber for growth of a III-V buffer layer on top of a III-V substrate, a chamber for growing the II-VI waveguide on top of the III-V buffer, and a transfer chamber connecting the two growth chambers, all under ultra-high vacuum conditions.

Figure 5:
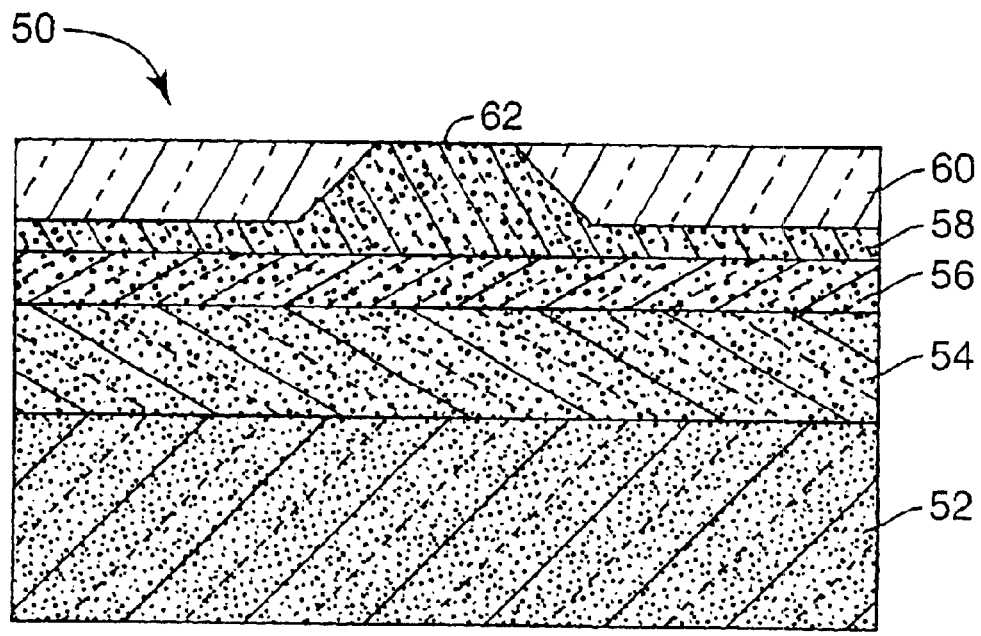
FIG. 5 illustrates a II-VI compound semiconductor waveguide cross-section.

FIG. 5 illustrates a waveguide 50 having a BeZnTe core.

Growth of III-V (including GaAs) buffers and growth initiation of II-VI materials on III-V buffers is described in "III-V/II-VI semiconductor interface fabrication method," U.S. Pat. No. 5,879,962. Using these techniques, a GaAs buffer 52 is grown in a first chamber and transferred under ultra-high vacuum conditions to a second chamber where a buffer layer of ZnSe (not shown) is grown. The ZnSe layer is grown to a thickness of 30 nm at a substrate temperature of 275° C.

After growing the ZnSe buffer layer, the sample is ready for the growth of the waveguide structure in the same chamber. The first layer of the waveguide structure is $Be_xZn_{(1-x)}Se$ lower cladding 54. For lattice-matching to GaAs, x=0.029. This layer is grown at approximately 1 μm/hr at a growth temperature of 275° C. The VI/II flux ratio is sufficiently group-VI rich such that the RHEED pattern is (2×1). The desired thickness of this layer is dictated by loss requirements of the waveguide, and is typically 3 μm or greater. In one embodiment, a thin (1 nm) layer of BeTe is grown on the BeZnSe to prevent excessive out-diffusion of Se, prior to raising the substrate temperature of the next layer.

Prior to growing the next layer, the substrate temperature is raised to approximately 600° C. When the substrate temperature is stabilized, the growth of the $Be_yZn_{(1-y)}Te$ core layer 56 is started. For lattice-matching to GaAs, y=0.935. The VI/II flux ratio was sufficiently group-VI rich such that the RHEED pattern was (2×1). The growth rate of this layer is approximately 1 μm/hr, and the total thickness is 1.0 μm to match the optical mode of the laser diode chip.

After growing the BeZnTe layer, the substrate temperature is lowered to approximately 275° C. for the growth of BeZnSe upper cladding. The same growth conditions are used as in the growth of the lower cladding layer 58. The thickness of this layer is 1.0 μm to match the position of the optical mode with that of the laser diode chip. A final thin (50 nm) layer of ZnSe (not shown) is grown to protect the Be-containing layers from oxidation when the sample is removed from the chamber.

To fabricate the tapered waveguide, photoresist (preferably NR7–1000PY, available from Futurrex, Inc., Franklin, N.J.) is appropriately patterned on the II-VI semiconductor, carefully aligned to a <110> axis. The pattern includes a tapered waveguide, which is 75 μm wide at the wide end, and 7.5 μm wide at the narrow end, as well as scattering segments. The form of the taper is a raised sine, and the length is 1 cm. The wafer is patterned by ion beam etching (500 eV Xe+ ions), etching away 0.75 μm of the upper cladding layer. The etched wafer is then immediately moved to a vacuum evaporator, where 0.75 μm of $MgF_2$ is deposited by electron-beam evaporation to form a "lateral cladding" filler material 60. The photoresist stripe is stripped with acetone, lifting off the $MgF_2$ over the unetched region, and leaving a planar surface. Bonding metal (100 nm Ti, 300 nm Au) is then vacuum deposited over the whole wafer, and the wafer is cleaved into bars (1 cm long). An anti-reflectivity coating (16.8 nm of $SiO_2$) is vacuum deposited on the wide ends of the waveguides. The narrow (output) ends of the waveguide are not coated. The bars are then cleaved into individual waveguide chips (1500 μm wide). In these waveguides, the center of the optical mode is 2.0 μm from the upper surface of the bonding metal.

Submount

For convenience, a thin (125 μm) silicon wafer is used for the submount. Alternative materials with higher thermal conductivity (e.g., diamond) could be used. The upper surface of the submount is coated with 50 nm of Pt and 3 μm of In by high vacuum evaporation. The Pt layer prevents the In from beading up on the submount surface when melted. The lower surface is coated with 100 nm Ti, and 300 nm of Au, also by high vacuum evaporation. The submount is 3 mm wide and 1.5 cm long.

Assembly Process

To assemble the complete laser, the laser diode chip is first placed near one end of the submount with its bonding metal layer in contact with the In-coated side of the submount. The laser diode chip is lightly pressed into the In with minimum sufficient force to make it stick. Next, the antireflective coating on the tapered waveguide chip is placed in contact with the antireflective coating on the laser diode chip. The tapered waveguide chip is then moved in order to align the tapered waveguide to the active stripe in the laser diode chip. This is accomplished using a microscope with an infrared video system, and imaging through the substrates of both the laser diode chip and the tapered waveguide chip. When the chips are aligned, the waveguide chip is gently pressed into the In and released. Next, the submount, laser diode chip and tapered waveguide chip are briefly heated in forming gas until the In melts and forms a bond with the bonding metals. Finally, the submount is soldered to a heat sink, which is attached to a thermo-electric cooler. The laser is operated by passing current through wires that are bonded to the n-ohmic contact metal and to the In.

Example 2

1480 nm Laser

This example describes a 1480 nm laser including an AlGaInAs—InP laser diode chip, a silicon oxynitride tapered waveguide chip, and a silicon submount.

AlGaInAs—InP Laser Diode Chip

In this example the laser diode wafer is grown by metal organic chemical vapor deposition (MOCVD) on a (100) InP:S wafer. All layers are nominally lattice-matched to the Inp. The lower cladding is InP:S (n=$10^{18}$ cm$^{-3}$), 0.8 μm thick, plus 0.1 μm of AlGaInAs:S (E$_g$=1.44 eV, n=$10^{18}$ cm$^{-3}$). The active region (laser waveguide core) is 0.28 μm thick undoped AlGaInAs (E$_g$=1.1 eV) with five GaInAs quantum wells at its center. The wells are separated from each other by 10 nm of AlGaInAs (E$_g$=1.1 eV). The thickness (growth time) of each of the quantum wells is adjusted to provide the desired laser wavelength (1480 nm). The upper cladding includes 0.1 μm of AlGaInAs:Zn (E$_g$=1.44 eV, p=$10^{18}$ cm$^{-3}$) and 1.3 μm of InP:Zn (p=$10^{18}$ cm$^{-3}$). The p-ohmic contact layers are 0.05 μm of GaInAsP (E$_g$=0.95 eV, p=2×$10^{18}$ cm$^{-3}$) and 0.2 μm of GaInAs:Zn (p=$10^{19}$ cm$^{-3}$).

Fabrication of the laser diode chip begins with deposition of the p-ohmic contact metal, consisting of 20 nm Pd, 100 nm Au and 2 nm Ti, on the contact layer. The Ti facilitated adhesion of photoresist in the next step. A 100 μm wide photoresist stripe is patterned on the p-ohmic contact metal, carefully aligned to a <110> axis. The wafer is then patterned by ion beam etching (500 eV Xe+ ions), etching through the p-ohmic contact metal, and 0.25 μm into the semiconductor. The etched wafer is then immediately moved to a vacuum evaporator, where 0.37 μm of Al$_2$O$_3$ is deposited by electron-beam evaporation. The photoresist stripe is stripped with acetone, lifting off the Al$_2$O$_3$ over the unetched stripe, and leaving a planar surface. Next, after photoresist is again applied and patterned, bonding metal (100 nm Ti and 300 nm Au) is deposited and patterned by lift-off into 1000 μm wide stripes, centered over the 100 μm wide active region. At this point the processing of the top surface is complete. The wafer is mounted with wax on a polishing tool, and the back side is polished to a specular surface. After being removed from the polishing tool, the back side of the wafer is cleaned and slightly etched. Photoresist is again applied and patterned and the back side n-ohmic contact metal (10 nm Pd, 25 nm Ge, 300 nm Au) is deposited by vacuum evaporation, and patterned into 1000 μm stripes by lift-off. These stripes are aligned with respect to the active stripes on the front of the wafer so as to allow a "window" through which one can see the active stripe through the InP substrate, using an infrared microscope.

The wafer is then cleaved into bars of length 1000 μm, and an antireflective coating (20.9 nm of Al$_2$O$_3$) is applied to the front facets, and a high reflectivity coating (a quarter-wavelength stack of MgF$_2$ and Si) is applied to the rear facets. The bars are then diced into chips (1500 μm wide), which are ready for assembly. In each of these chips, the center of the optical mode is 2.14 μm from the upper surface of the bonding metal.

Silicon Oxynitride Tapered Waveguide

FIG. 6 illustrates tapered waveguide 70 of this example, which is formed by starting with (100) silicon wafer 72, polished on both sides. An oxide is grown on the top surface of the wafer to a thickness of at least 3 μm, forming lower cladding 74. Using standard techniques, photoresist is patterned on the lower cladding, defining small (10 μm square) alignment marks, precisely aligning them with a <110> axis of the substrate. The wafer is placed in a vacuum deposition system, and a thin layer (100 nm) of Ge is deposited by electron-beam evaporation. After being removed from the deposition system, the photoresist is removed in acetone (other appropriate solvents could be used), thereby patterning the Ge into small alignment marks by "lift-off".

Using standard techniques, photoresist (preferably NR7–1000PY, available from Futurrex, Inc., Franklin, N.J.) is again patterned on the lower cladding, defining the desired waveguide pattern (as well as scattering segments), and precisely aligning it with the Ge alignment marks, which are positioned near the wide end of each tapered waveguide pattern. In this example, the waveguide tapers from 100 μm wide to 7.5 μnm wide over a length of 2.0 cm. The form of the taper is a raised sine. The wafer is placed in a vacuum deposition system, and a thin layer of MgF$_2$ (the optical confinement material 76) is deposited by electron-beam evaporation (alternatively, other deposition techniques would work, including thermal evaporation, or sputtering). After being removed from the deposition system, the photoresist is removed in acetone (other appropriate solvents could be used), thereby patterning the MgF$_2$ by "lift-off". In this example, the MgF$_2$ is 37.5 nm thick. Next, the wafer is placed in a plasma-enhanced chemical vapor deposition (PECVD) system. Silicon oxynitride core 78 is deposited, followed by the silica upper cladding. In this example, the core has a thickness of 0.4 μm and the PECVD gas flows are adjusted to provide a nitrogen content in the core appropriate for a refractive index of 1.668 at the design wavelength of 1480 nm. Upper cladding 80 had a thickness of 1.64 μm. These layer thicknesses are chosen to nearly match the size and position of the optical mode in the laser diode chip. The resulting waveguide structure has a very nearly planar surface (suitable for bonding to a submount) and support a single-transverse-mode at the design wavelength of 1480 nm. The waveguide absorption loss may be minimized by a final high-temperature (e.g., 1140° C.) anneal to reduce hydrogen in the PECVD layers.

Bonding metal (not shown) (100 nm Ti, 300 nm Au) is then vacuum deposited over the whole wafer, and the wafer is cleaved into bars (2 cm long). An anti-reflectivity coating (26.8 mn of $MgF_2$) is vacuum deposited on the wide ends of the waveguides. In this example, the narrow (output) ends of the waveguide are not coated. The bars are then cleaved into individual waveguide chips (1500 $\mu$m wide). In these waveguides, the center of the optical mode is 2.14 $\mu$m from the upper surface of the bonding metal.

Submount and Assembly Process

The submount and assembly process are identical to those in Example 1, with one exception. In this example, the tapered waveguide, defined by the thin $MgF_2$ layer, is very difficult to see through the Si substrate, using the microscope with an infrared video system. However, the Ge alignment marks are easily seen, allowing the laser diode chip to be accurately aligned with the tapered waveguide, because the position of the waveguide is known with respect to the alignment marks.

The present invention would work equally well with other combinations of the materials systems for the laser diode chip and the waveguide chip. For example, the AlGaAs—InGaAs laser diode chip of Example 1 could be effectively coupled with the silicon oxynitride waveguide chip of Example 2 if minor adjustments to layer thicknesses were made to assure good alignment of the core layers. Similarly, the AlGaInAs—InP laser diode chip of Example 2 could be effectively coupled with the BeZnTe waveguide chip of Example 1, provided appropriate thickness adjustments are made.

Various modifications and alterations of this invention will become apparent to those skilled in the art without departing from the scope and spirit of this invention and it should be understood that this invention is not to be unduly limited to the illustrative embodiments set forth herein.

What is claimed is:

1. A laser comprising:
   a wide-aperature laser diode chip, and
   a passive tapered waveguide having a wide aperature, which waveguide comprises,
   a lower cladding layer,
   a core layer, and
   an upper cladding layer,
   wherein the layers of the waveguide comprise materials of high optical damage threshold, and wherein the chip is optically coupled to the waveguide to form an optical cavity.

2. The laser of claim 1 wherein the laser is configured to produce a single transverse mode.

3. The laser of claim 1 wherein the material is a semiconductor having a large band gap energy.

4. The laser of claim 1 wherein the waveguide comprises a crystalline material.

5. The laser of claim 4 wherein the crystalline material is a single crystal.

6. The laser of claim 4 wherein the crystalline material comprises a II-VI compound semiconductor material.

7. The laser of claim 6 wherein the II-VI compound semiconductor material comprises BeZnTe.

8. The laser of claim 1 wherein the waveguide comprises a glass.

9. The laser of claim 1 wherein reflections at the interface of the laser diode chip and waveguide are minimized.

10. The laser of claim 9 wherein the laser diode chip includes an anti-reflective coating on its surface at the interface of the laser diode chip and waveguide.

11. The laser diode of claim 9 wherein each of the laser diode chip and waveguide include an anti-reflective coating on its surface at the interface of the laser diode and waveguide.

12. The laser of claim 1 wherein the waveguide has a length of 0.5 centimeters or more.

13. The laser of claim 1 further comprising an optical amplifier.

14. The laser of claim 13 wherein the amplifier is doped with a rare earth metal.

15. The laser of claim 14 wherein the amplifier is doped with erbium.

16. The laser of claim 15 wherein the amplifier is further doped with thulium.

17. The laser of claim 13 wherein the amplifier is a raman amplifier.

18. The laser of claim 15 wherein the laser has an output beam wavelength of about 980 nm or about 1480 nm.

19. The laser of claim 17 wherein the laser has an output beam wavelength of about 1365 nm to about 1530 nm.

20. A laser system comprising the laser of claim 1 and a Bragg grating.

21. The laser system of claim 20 wherein the Bragg grating is formed in the waveguide.

22. The laser system of claim 20 wherein the Bragg grating is in a fiber pigtail that is coupled to the waveguide.

23. The laser of claim 1 wherein the wide-aperture laser diode chip has an aperture greater than 10 micrometers in width.

24. The laser of claim 1 wherein the laser diode chip and the waveguide are aligned on a submount.

25. The laser of claim 1 wherein the waveguide has a length of 0.5 cm or more.

26. The laser of claim 1 wherein the tapered waveguide is of the raised-sine form.

* * * * *

UNITED STATES PATENT AND TRADEMARK OFFICE
CERTIFICATE OF CORRECTION

PATENT NO. : 6,873,638 B2
DATED : March 29, 2005
INVENTOR(S) : Haase, Michael A.

It is certified that error appears in the above-identified patent and that said Letters Patent is hereby corrected as shown below:

<u>Column 9,</u>
Line 44, delete "Inp" and insert in place thereof -- InP --.

<u>Column 11,</u>
Line 8, delete "mn" and insert in place thereof -- nm --.

Signed and Sealed this

Thirteenth Day of September, 2005

JON W. DUDAS
*Director of the United States Patent and Trademark Office*